United States Patent
Rashid

(10) Patent No.: US 7,109,768 B2
(45) Date of Patent: Sep. 19, 2006

(54) CLOSED-LOOP CONTROL OF DRIVER SLEW RATE

(75) Inventor: Mamun Ur Rashid, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/881,003

(22) Filed: Jun. 29, 2004

(65) Prior Publication Data

US 2005/0285646 A1 Dec. 29, 2005

(51) Int. Cl.
*H03K 5/12* (2006.01)
(52) U.S. Cl. .................................. 327/170; 327/276
(58) Field of Classification Search ................ 327/377, 327/376, 374, 286, 285, 284, 283, 282, 281, 327/280, 279, 278, 276, 170
See application file for complete search history.

(56) References Cited

U.S. PATENT DOCUMENTS

| | | | | |
|---|---|---|---|---|
| 5,471,165 A | * | 11/1995 | Liedberg | 327/250 |
| 5,986,489 A | * | 11/1999 | Raza et al. | 327/170 |
| 6,066,971 A | * | 5/2000 | Pappert et al. | 327/170 |
| 6,087,868 A | * | 7/2000 | Millar | 327/156 |
| 6,262,617 B1 | * | 7/2001 | McClure | 327/270 |
| 6,333,654 B1 | * | 12/2001 | Harris et al. | 327/170 |
| 6,342,800 B1 | * | 1/2002 | Stark et al. | 327/170 |
| 6,424,128 B1 | * | 7/2002 | Hiraki et al. | 323/268 |

* cited by examiner

*Primary Examiner*—Quan Tra
*Assistant Examiner*—Khareem E. Almo
(74) *Attorney, Agent, or Firm*—Schwegman, Lundberg, Woessner & Kluth, P.A.

(57) ABSTRACT

A device includes an output circuit to output an output signal. The device also includes a control loop circuit to measure the real slew of the output signal. The control loop circuit compares the real slew with a target slew adjusts the output circuit when the real slew and the target are mismatched.

19 Claims, 11 Drawing Sheets

CLOSED-LOOP CONTROL OF DRIVER SLEW RATE

FIELD

Embodiments of the present invention relate generally to drivers in electrical devices.

BACKGROUND

Electrical devices such as processors, memory controllers, and graphics controllers reside in many computers and electronic systems. A typical electrical device has drivers to drive signals from one device to another device.

Drivers are often designed to drive signals with a specific slew rate, which is a rate for a signal to switch between different signal levels within a specified time. In some cases, a slew rate greater than the specified slew rate may introduce undesirable noise to the signal. A slew rate less than the specified slew rate may lengthen the time for the signal to switch between expected signal levels, thereby limiting the over operating frequency of the device.

DESCRIPTION OF EMBODIMENTS

Figure 1:
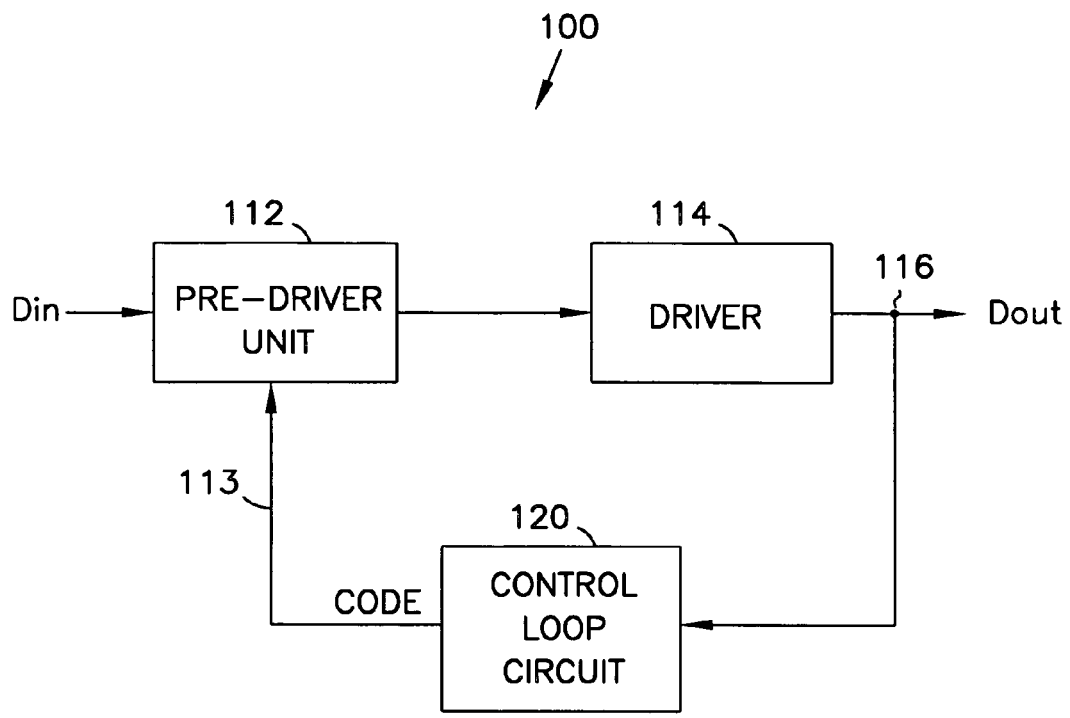
FIG. 1 shows an apparatus having an output circuit and a control loop circuit to according to embodiments of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the claims and all available equivalents.

FIG. 1 shows an apparatus having an output circuit and a control loop circuit. Apparatus 100 includes an output circuit 110 and a control loop circuit 120. Output circuit 110 includes a pre-driver unit 112 to receive an input signal Din. Output circuit 110 also includes a driver 114 to drive an output signal Dout at an output node 116. The Dout signal is generated based on the Din signal.

Pre-driver unit 112 also receives a slew code CODE at control nodes 113 to influence a slew of the Dout signal. The slew of the Dout signal is the time for the Dout signal to switch between two reference signal levels. In some embodiments, the CODE is a combination of multiple binary bits presented by a number of different signals. The CODE has a value. Each value of the CODE corresponds to a different value of the slew of the Dout signal. In some embodiments, the CODE may be initially set at a value such that the slew of the Dout signal at output node 116 is equaled to (matched) or approximately close to a target slew. The target slew is an expected slew of the Dout signal according a design specification.

In some cases, variations in factors such as manufacturing process, voltage supply, and operating temperature may cause the slew of the Dout signal to be different from the target slew (expected slew).

Control loop circuit 120 monitors the Dout signal to control the CODE to keep the slew of the Dout signal to match the target slew. In some embodiments, control loop circuit 120 measures the slew of the Dout signal and compares the measured slew with the target slew. If the measured slew and the target slew are not equaled (mismatched), control loop circuit 120 adjusts the CODE. In some embodiments, control loop circuit 120 adjusts the CODE by increasing or decreasing the value of the CODE to increase or decrease the slew of the Dout signal until the slew of the Dout signal matches the target slew.

Figure 2:
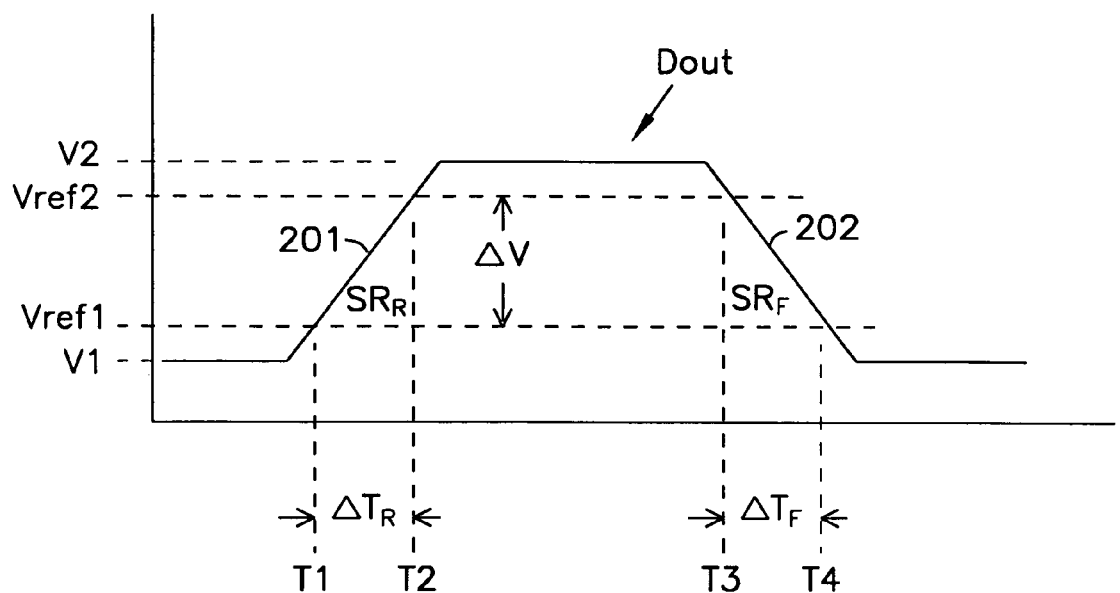
FIG. 2 is an exemplary output signal of FIG. 1.

The Dout signal also has a slew rate, which is a function of voltage divided by the slew of the Dout signal. Thus, when the slew of the Dout signal is adjusted, the slew rate of the Dout signal is also adjusted. FIG. 2 discusses the slew and the slew rate of the Dout signal.

FIG. 2 is an exemplary timing diagram for FIG. 1. In FIG. 2, V1, Vref1, Vref2, and V2 represent voltages. T1, T2, T3, and T4 represent times. $\Delta V$ (delta V) is the difference between Vref2 and Vref1.

$\Delta T_R$ (delta $T_R$) is the difference between T2 and T1. $T_R$ is the slew of rising edge 201 of the Dout signal. $SR_R$ is the slew rate (slope) of rising edge 201. $SR_R$ is a function of delta V divided by delta $T_R$.

Delta $T_F$ is the difference between T3 and T4. $T_F$ is the slew of falling edge 202 of the Dout signal. $SR_F$ is the slew rate (slope) of falling edge 202. $SR_F$ is a function of delta V divided by delta $T_F$.

As discussed above, a slew of a signal is the time for a signal (e.g., Dout) signal to switch between two reference signal levels. In this specification, the term "slew" of a signal refers to a rising slew, a falling slew, or both the rising slew and the falling of the signal. The rising slew of a signal is the slew of the rising edge of a signal. The falling slew of a signal is the slew of the falling edge of a signal. For example, in FIG. 2, delta $T_R$ is the rising slew of the Dout signal; delta $T_F$ is the falling slew of the Dout signal.

As discussed above, a slew rate of a signal is a function of voltage divided by the slew of the signal. In this specification, the term "slew rate" of a signal refers to a rising slew rate, a falling slew rate, or both the rising slew rate and the falling slew rate of the signal. The rising slew rate of a signal is a function of voltage divided by the rising slew of the signal. The falling slew rate of a signal is a function of voltage divided by the falling slew of the signal. For example, in FIG. 2, the rising slew rate $SR_R$ of the Dout signal is a function of delta V divided by delta $T_R$; the falling slew rate $SR_F$ of the Dout signal is a function of delta V divided by delta $T_F$.

Figure 3:
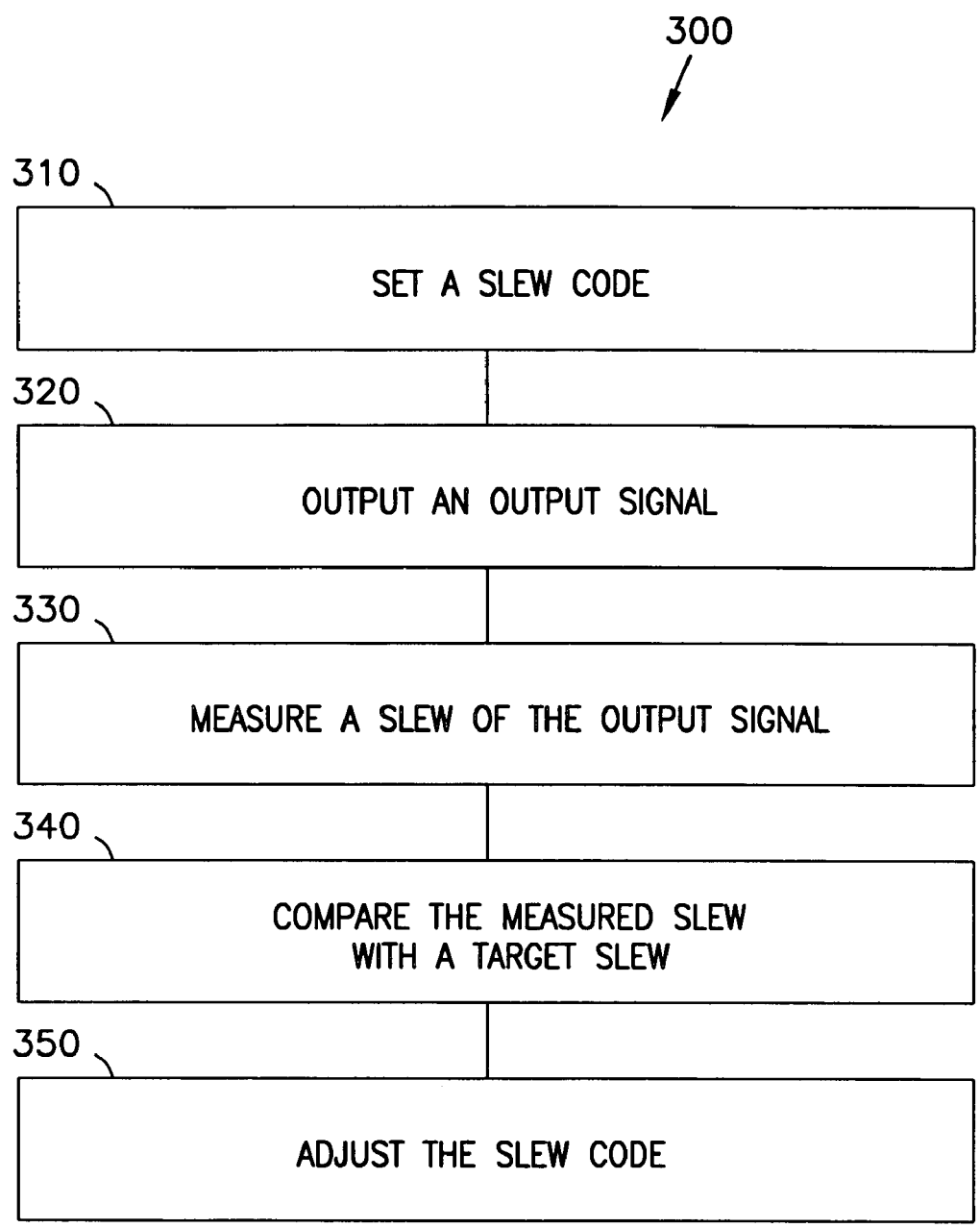
FIG. 3 is a flowchart of a method of controlling a slew rate of a signal.

FIG. 3 is a flowchart of a method of controlling a slew of a signal. Since the slew rate of a signal is a function of the slew of the signal, controlling the slew of a signal also controls the slew rate of the signal. Thus, method 300 also applies to controlling a slew rate of a signal. Method 300 adjusts both the rising slew and the falling slew of a signal to allow each of the rising slew and the falling slew to match a target slew. Method 300 may be used to control the slew of the Dout signal of FIG. 1.

Box 310 sets a slew code applied to a signal path. In some embodiments, the slew code is a combination of binary bits. Each value of the slew code corresponds to a slew of a signal such as the Dout signal of FIG. 1. The signal path may be a path including a pre-driver unit and a driver such as pre-driver unit 112 and driver 114 of FIG. 1. The slew code in box 310 may be the CODE of FIG. 1. In some embodiments, the slew code may be set by a programming process. For example, the slew code in box 310 or the CODE in FIG. 1 may be set by programming programmable circuit elements in a control loop circuit such as control loop circuit 120 of FIG. 1. Since the slew code or the CODE in FIG. 1 may be set or programmed, any value of the slew code may be chosen to select an appropriate initial value for the slew or the slew rate of the signal such as the Dout signal.

Box 320 outputs an output signal at an output node of the signal path. The output signal is generated from an input signal received at an input node of the signal path. The input and output signals in method 300 may be the Din and Dout signals of FIG. 1. The slew code of box 310 corresponds to a slew of the output signal.

Box 330 measures the slew of the output signal at the output of the signal path to obtain a measured slew. The measured slew may be the rising slew or the falling slew of the output signal. For example, box 330 may measure the rising slew of the output signal at one time and may measure the falling slew of the output signal at another time. In some embodiments, box 330 measures the rising slew and falling slew based on consecutive rising and falling edges of the output signal.

Box 340 compares the measured slew with a target slew to provide a comparison result.

Box 350 adjusts the slew code based on the comparison result to adjust the slew of the output signal. For example, box 350 may increase or decrease the value of the slew code to increase or decrease the value of the slew of the output signal.

Boxes 330, 340, and 350 measures, compares, and adjusts the slew of the output signal until the slew of the output signal matches the target slew. The processes in boxes 330, 340, and 350 may be preformed by a control loop circuit such as control loop circuit 120 of FIG. 1.

Figure 4:
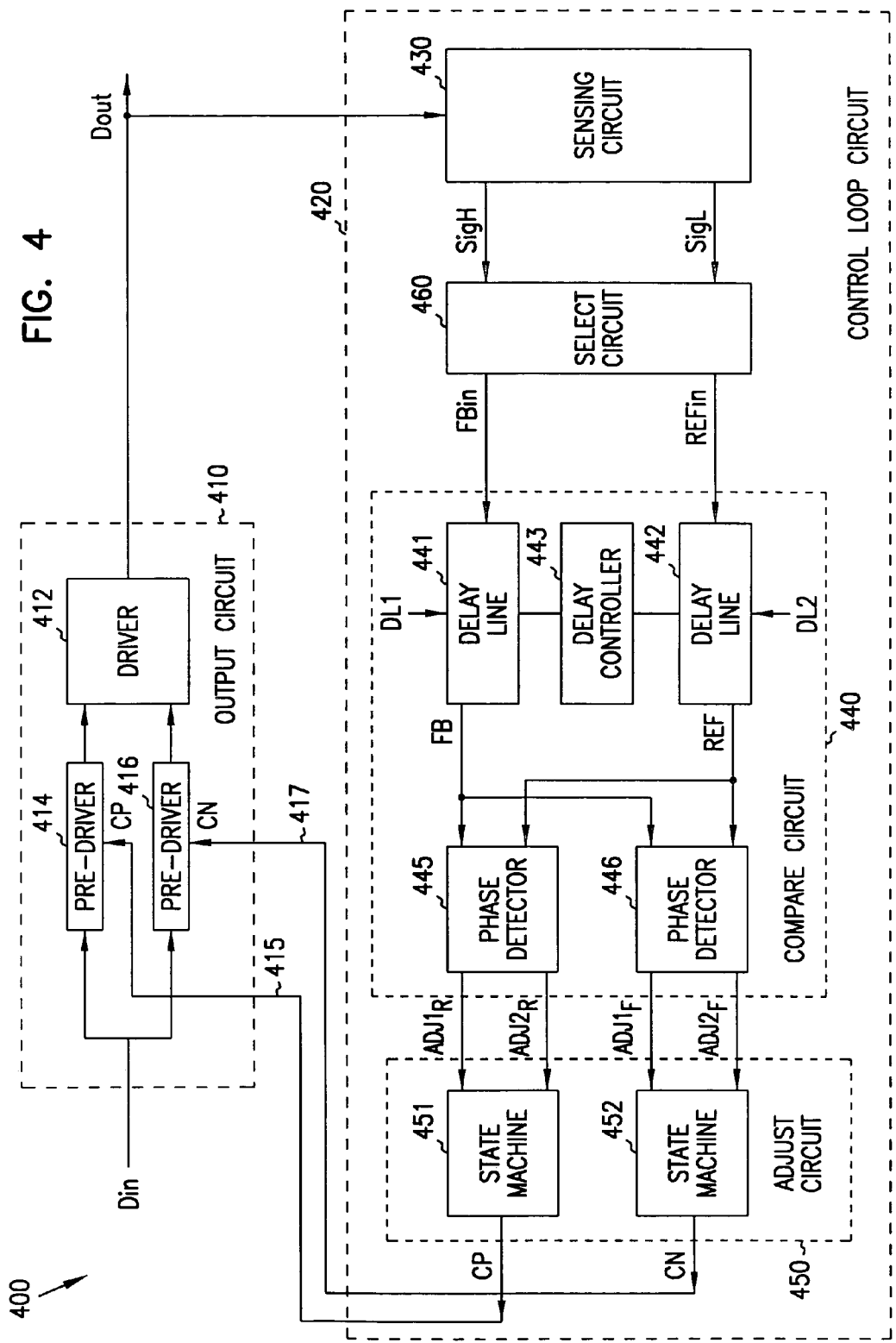
FIG. 4 shows an integrated circuit having an output circuit and a control loop circuit according to embodiments of the invention.

FIG. 4 shows an integrated circuit having an output circuit and a control loop circuit. Integrated circuit 400 includes an output circuit 410 and a control loop circuit 420. Output circuit 410 receives an input signal Din and outputs an output signal Dout. The Dout signal has a slew. Control loop circuit 420 controls output circuit 410 to match the slew of the Dout signal with a target slew.

Output circuit 410 has a driver 412 to drive the Dout signal. Output circuit 410 also includes a pre-driver circuit formed by pre-drivers 414 and 416. Pre-driver 414 receives a slew code CP at control nodes 415. Pre-driver 416 receives a CN code at control nodes 417. In some embodiments, each of the CP and CN codes includes multiple bits (digits); each bit may represent a binary value. The value of the CP code corresponds to a value of the rising slew of the Dout signal. The value of the CN code corresponds to a value of the falling slew of the Dout signal.

Control loop circuit 420 includes a sensing circuit 430 to measure the slew of the Dout signal including a rising slew and a falling slew of the Dout signal. A compare circuit 440 compares the measured slew with the target slew. An adjust circuit 450 adjusts the CP and CN codes based on the result of the comparison.

A select circuit 460 allows control loop circuit 420 to switch between measurement of the rising slew and measurement of the falling slew of the Dout signal. For example, control loop circuit 120 measures a first rising slew based on a first rising edge of the Dout signal, then at the next (consecutive) falling edge of the Dout signal, control loop circuit 120 measures the falling slew. Control loop circuit 120 measures a rising slew (second rising slew) at a second rising edge occurred consecutively after the previous falling edge of the Dout signal. Thus, in some embodiments, control loop circuit 420 performs both the measurement of the rising slew and the measurement of the falling slew based on consecutive rising edge and falling edge of the Dout signal.

Figure 5:
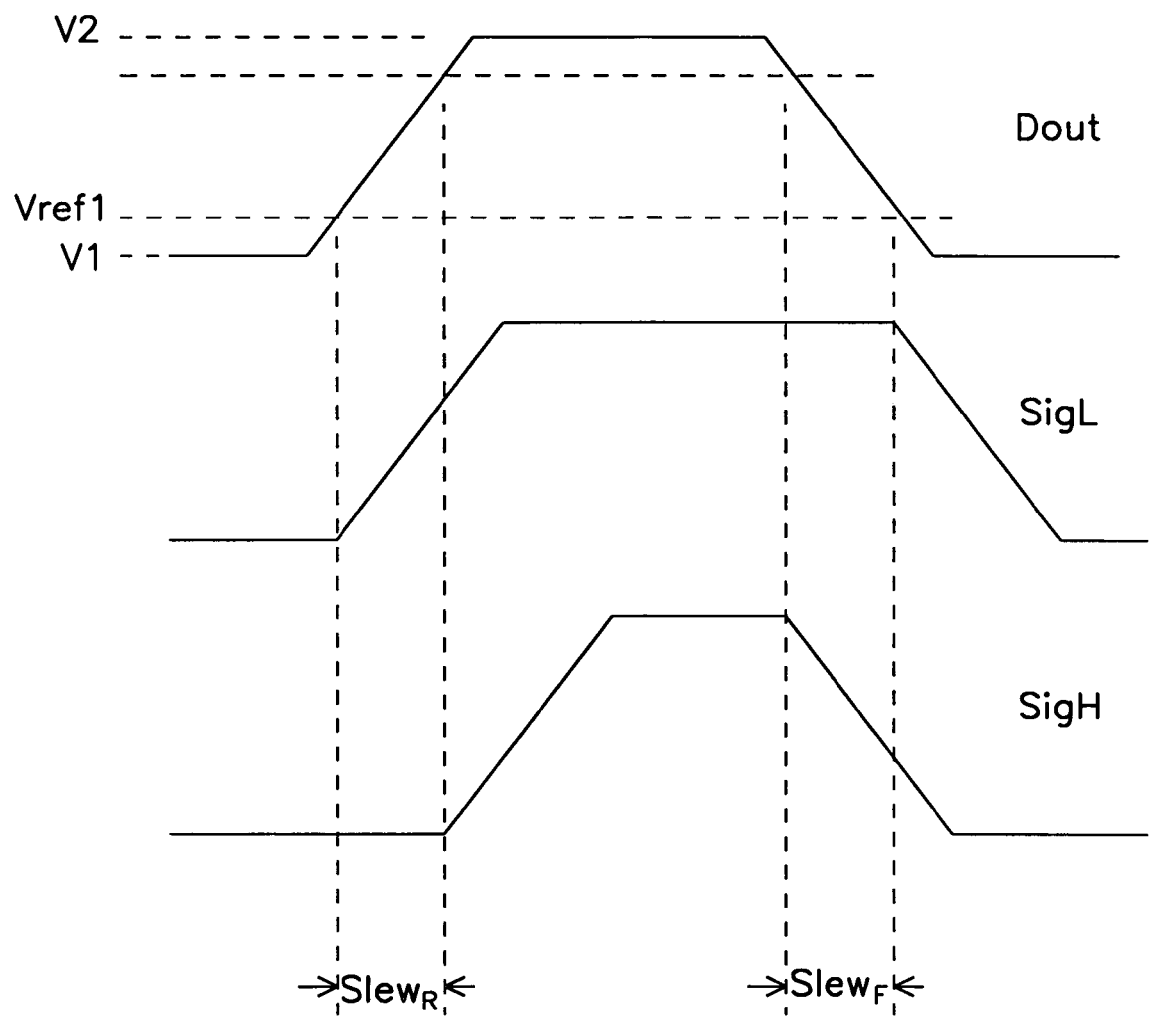
FIG. 5 is an exemplary timing diagram showing signal relationships among various signals of the integrated circuit of FIG. 4.

Sensing circuit 430 outputs measured signals SigL and SigH. The signal relationship between the SigL and SigH signals represents the measured slew of the Dout signal. FIG. 5 (described below) shows the signal relationships among the Dout, SigL, and SigH signals.

Compare circuit 440 includes delay locked loop (DLL) circuit formed by delay lines 441 and 442, and a delay controller 443. Compare circuit 440 also includes a phase detector circuit formed by phase detectors 445 and 446. Delay line 441 receives a delay code DL1. Delay line 442 receives a delay code DL2. Delay code DL1 causes delay line 441 to delay a signal by a first delay (time delay). Delay code DL2 causes delay line 442 to delay a signal by a second delay (time delay). DL1 and DL2 are set such that the difference between the first delay and the second delay is equivalent to the target slew.

In some embodiments, each of the delay codes DL1 and DL2 includes one or more bits, for example, binary bits. Integrated circuit 400 may include a delay code generator having elements to store the values of DL1 and DL2. In some embodiments, the elements of the delay code generator are programmable elements which are configurable or programmable to set different values of each of DL1 and DL2 delay codes.

Delay line 441 delays the FBin signal by a first delay to provide a feedback signal FB. Thus, the FB signal is the FBin signal delayed by the first delay set by delay code DL1. Delay line 442 delays the REFin signal by the second delay to provide a reference signal REF signal. Thus, the REF signal is the REFin delayed by the second delay set by delay code DL2. Delay controller 443 controls operations of the delay lines 411 and 412.

Each of the phase detectors 445 and 446 receives both the FB and REF signals. Phase detector 445 detects the timing difference between the rising edges of the FB and REF signals to control adjust control signals $ADJ1_R$ and $ADJ2_R$. Phase detector 446 detects the phase difference between the falling edges of the FB and REF signals to control adjust control signals $ADJ1_F$ and $ADJ2_F$.

Adjust circuit 450 adjusts the value of the CP code based on the $ADJ1_R$ and $ADJ2_R$ signals. Adjust circuit 450 adjusts the values of the CN code based on the $ADJ1_F$ and $ADJ2_F$ signals. Adjust circuit 450 includes state machines 451 and 452.

State machine 451 includes output nodes connected to nodes 415 to modify the CP code in response to the $ADJ1_R$ and $ADJ2_R$ signals. For example, state machine 451 may increase the value of the CP code when the $ADJ1_R$ signal is activated and decreases the value of the CP code when the $ADJ2_R$ signal is activated. In some embodiments, state machine 451 includes a counter to increase or decrease the value of the CP code.

State machine 452 includes output nodes connected to control nodes 417 to modify the CN code in response to the $ADJ1_F$ and $ADJ2_F$. For example, state machine 452 may increase the value of the CN code when the $ADJ1_F$ signal is activated and decreases the value of the CN code when the $ADJ2_F$ signal is activated. In some embodiments, state machine 452 includes a counter to increase or decrease the value of the CN code.

Control loop circuit 420 adjusts the CP and CN codes until each of the rising slew and falling slew of the Dout signal matches the target slew. The rising slew matches the target slew when the rising edges of the FB and REF signals are aligned. The falling slew matches the target slew occurs when the falling edges of the FB and REF signals are aligned. In some embodiments, phase detector 445 deactivates both of the $ADJ1_R$ and $ADJ2_R$ signals when the rising edges of the FB and REF signals are aligned; and phase detector 446 deactivates both of the $ADJ1_F$ and $ADJ2_F$ when the falling edges of the FB and REF signals are aligned. When the $ADJ1_R$, $ADJ2_R$, $ADJ1_F$, and $ADJ2_F$ signals are deactivated indicating that the slew of the Dout signal matches the target slew, adjust circuit 450 stops adjusting the CP and CN codes.

In some embodiments, after the slew of the Dout signal matches the target slew, control loop circuit 420 stops monitoring the Dout signal and keeps the values of the CP and CN codes at a fixed value. In other embodiments, after the slew of the Dout signal matches the target slew, control loop circuit 420 continues to monitor the Dout signal and to adjust the values of the CP and CN when appropriate.

FIG. 5 is an exemplary timing diagram showing signal relationships among various signals of the integrated circuit of FIG. 4. FIG. 5 shows signal relationships among the signals Dout, SigL, and SigH of FIG. 4. The SigL signal has a rising edge beginning to rise when the rising edge of the Dout signal is at Vref1. The SigH signal has a rising edge beginning to rise when the rising edge of the Dout signal is at Vref2. $Slew_R$ is the difference in time between the rising edges of the SigL and SigH signals. $Slew_R$ represents the rising slew (measured slew) of the Dout signal.

The SigL signal has a falling edge beginning to fall when the falling edge of the Dout signal is at Vref2. The SigH signal has a falling edge beginning to fall when the falling edge of the Dout signal is at Vref2. $Slew_F$ is the difference in time between the falling edges of the SigH and SigH signals. $Slew_F$ represents the falling slew (measured slew) the Dout signal. In comparing with FIG. 2, $Slew_F$ is equivalent to delta $T_R$ and $Slew_F$ is equivalent to delta $T_F$. Control loop circuit 420 of FIG. 4 uses the SigL and SigH signals to compare each of the rising slew ($Slew_R$) and the falling slew ($Slew_F$) of the Dout signal with the target slew.

Figure 6:
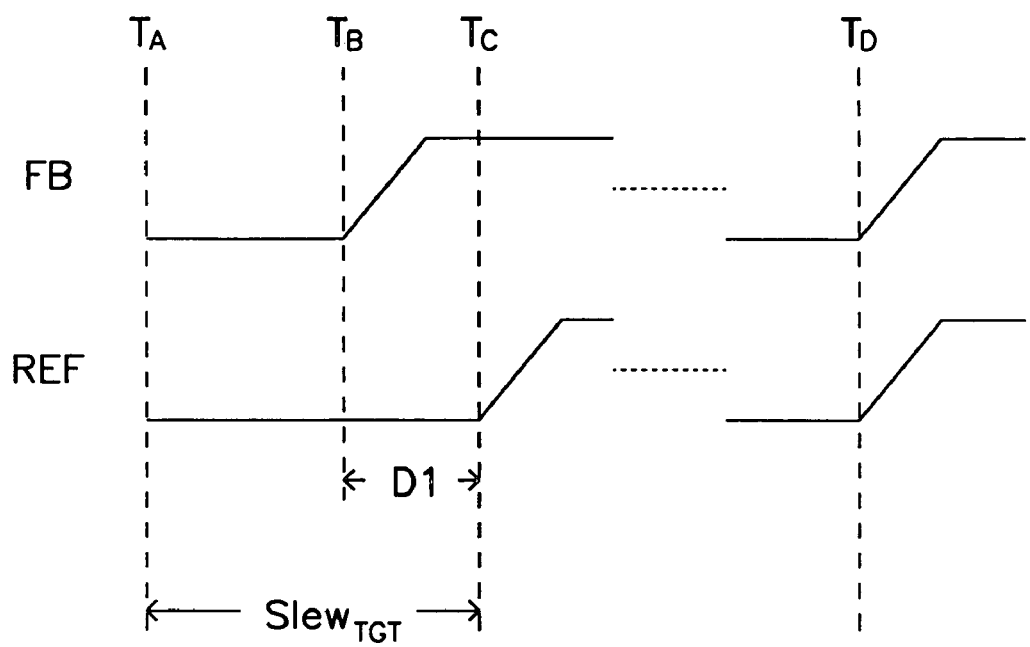
FIG. 6 is an exemplary timing diagram showing a first case of a mismatch between a rising slew and a target slew.

FIG. 6 is an exemplary timing diagram of various signals of the integrated circuit of FIG. 4 showing a first case of a mismatch between the rising slew and the target slew. FIG. 6 shows the rising edges of the FB and REF signals and times $T_A$, $T_B$, $T_C$, and $T_D$. $Slew_{TGT}$ represents the target slew. The relationship between the rising edges of the FB and REF signals indicates whether the rising slew of the Dout signal of FIG. 4 matches the target slew $Slew_{TGT}$. The rising slew and the target slew are mismatched when the rising edges of the FB and REF signals are misaligned. The rising slew and the target slew are matched when the rising edges of the FB and REF signals are aligned.

Between times Tb and Tc in FIG. 6, the rising edge of the FB signal leads the rising edge of the REF signal. A time delay D1 exists between the rising edges of the FB and REF signals indicating that the rising slew and the target slew are mismatched. Control loop circuit 420 of FIG. 4 reduces D1 until the rising edges of the FB and REF signals are aligned.

As described in FIG. 4, phase detector 445 detects the rising edges of the FB and REF signals. In FIG. 6, when the edges of the FB and REF signals are not aligned between times $T_B$ and $T_C$, phase detector 445 activates one of the $ADJ1_R$ signal $ADJ2_R$ signals. State machine 451 of FIG. 4 responds to the $ADJ1_R$ or $ADJ2_R$ signal to adjust (increases or decreases) the value of the CP code to reduce D1. The adjustment process repeats until the rising edge of the FB and REF signals are aligned. For example, between time $T_C$ and $T_D$, control loop circuit 420 of FIG. 4 may perform a number of measurements and adjustments to modify the value of the CP code. At time $T_D$, the rising edges of the FB and REF signals are aligned, indicating that the rising slew matches the target slew.

Figure 7:
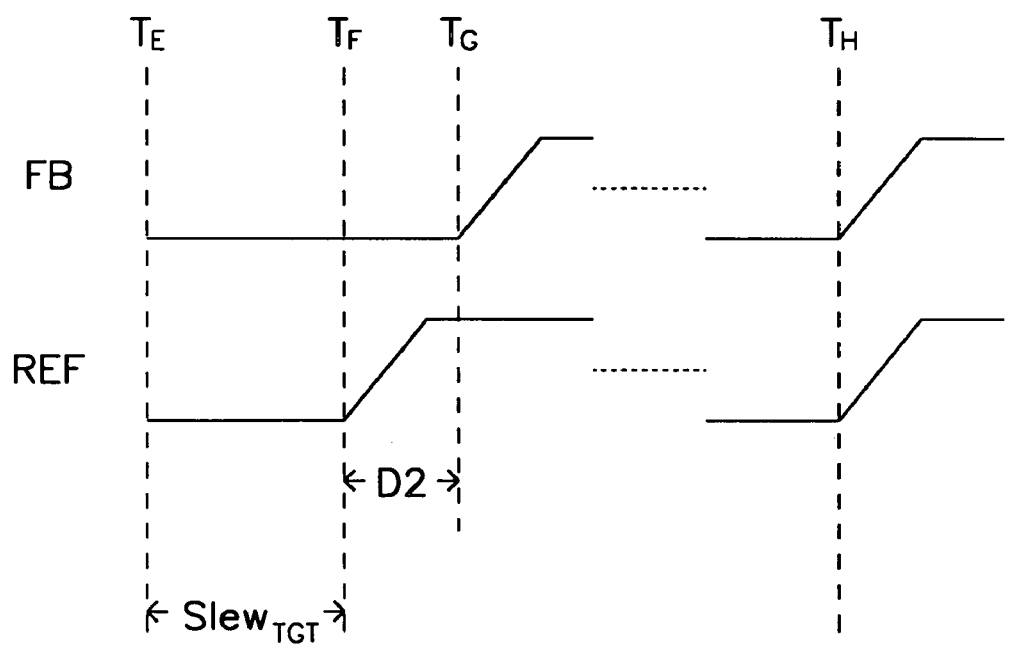
FIG. 7 is an exemplary timing diagram showing a second case of a mismatch between the rising slew and the target slew.

FIG. 7 is an exemplary timing diagram of various signals of the integrated circuit of FIG. 4 showing a second case of mismatch between the rising slew and the target slew. FIG. 7 shows the rising edges of the FB and REF signals and times $T_E$, $T_F$, $T_G$, and $T_H$. FIG. 7 is similar to FIG. 6. However, in FIG. 7 the rising edge of the FB signal lags the rising edge of the REF signal. A time delay D2 exists between the rising edges of the FB and REF signals. Control loop circuit 420 of FIG. 4 also reduces D2 until the rising edges of the FB and REF signals are aligned. For example, the rising edges of the FB and REF signals are aligned at time $T_H$. Thus, at time $T_H$, the rising slew matches the target slew.

Figure 8:
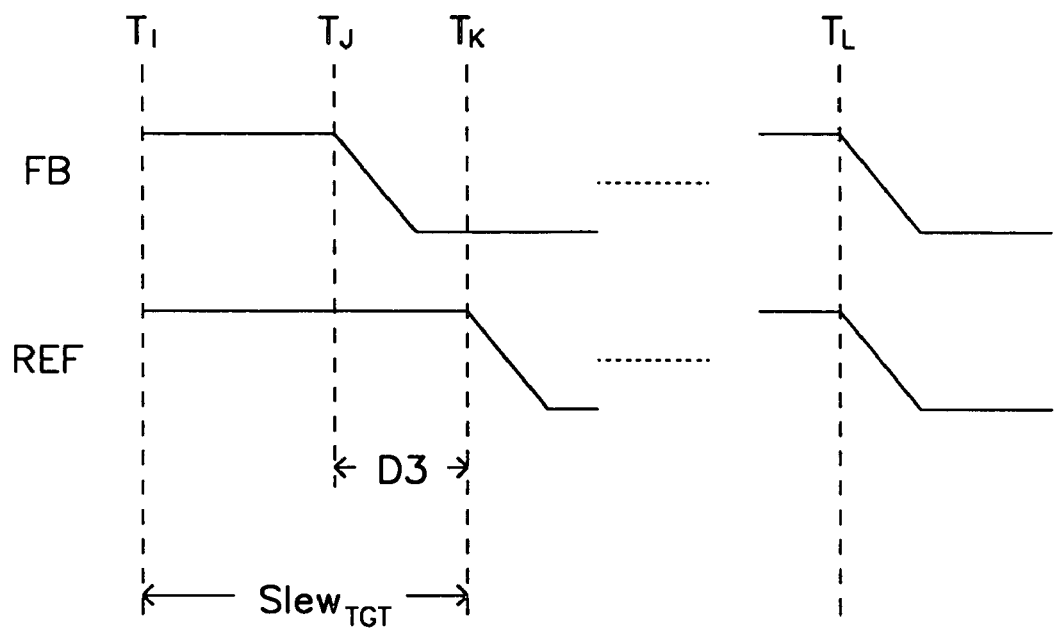
FIG. 8 is an exemplary timing diagram showing a first case of a mismatch between a falling slew and the target slew.

FIG. 8 is an exemplary timing diagram of various signals of the integrated circuit of FIG. 4 showing a first case of a mismatch between the falling slew and the target slew. FIG. 8 shows the falling edges of the FB and REF signals and times $T_I$, $T_J$, $T_K$, and $T_L$. $Slew_{TGT}$ represents the target slew. The relationship between the falling edges of the FB and REF signals indicates whether the falling slew of the Dout signal of FIG. 4 matches the target slew $Slew_{TGT}$. The falling slew and the target slew are mismatched when the falling edges of the FB and REF signals are misaligned. The falling slew and the target slew are matched when the falling edges of the FB and REF signals are aligned.

Between times $T_J$ and $T_K$ in FIG. 8, the falling edge of the FB signal leads the falling edge of the REF signal. A time delay D3 exists between the falling edges of the FB and REF signals indicating that the falling slew and the target slew are mismatched. Control loop circuit 420 of FIG. 4 reduces D3 until the falling edges of the FB and REF signals are aligned.

As described in FIG. 4, phase detector 446 detects the falling edges of the FB and REF signals. In FIG. 8, when the edges of the FB and REF signals are not aligned between times $T_J$ and $T_K$, phase detector 446 activates one of the ADJ1$_F$ signal ADJ2$_F$ signals. State machine 452 of FIG. 4 responds to the ADJ1$_F$ or ADJ2$_F$ signal to adjust (increase or decrease) the value of the CN code to reduce D3. The adjustment process repeats until the falling edge of the FB and REF signals are aligned. For example, between time $T_K$ and $T_L$, control loop circuit 420 of FIG. 4 may perform a number of measurements and adjustments to modify the value of the CP code. At time $T_L$, the rising edges of the FB and REF signals are aligned, indicating that the falling slew matches the target slew.

Figure 9:
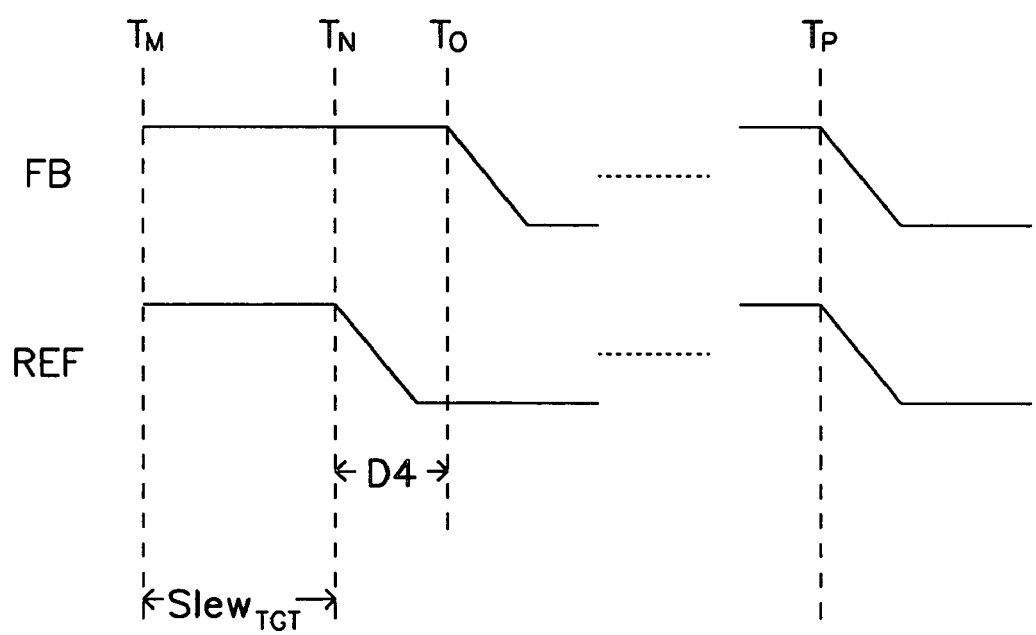
FIG. 9 is an exemplary timing diagram showing a second case of a mismatch between the falling slew and the target slew.

FIG. 9 is an exemplary timing diagram of various signals of the integrated circuit of FIG. 4 showing a second case of a mismatch between the falling slew and the target slew. FIG. 9 shows the falling edges of the FB and REF signals and times $T_M$, $T_N$, $T_O$, and $T_P$. FIG. 9 is similar to FIG. 8. However, in FIG. 9 the falling edge of the FB signal lags the falling edge of the REF signal. A time delay D4 exists between the falling edges of the FB and REF signals. Control loop circuit 420 of FIG. 4 also reduces D4 until the falling edges of the FB and REF signals are aligned. For example, the falling edges of the FB and REF signals are aligned at time $T_P$. Thus, at time $T_P$, the falling slew matches the target slew.

Figure 10:
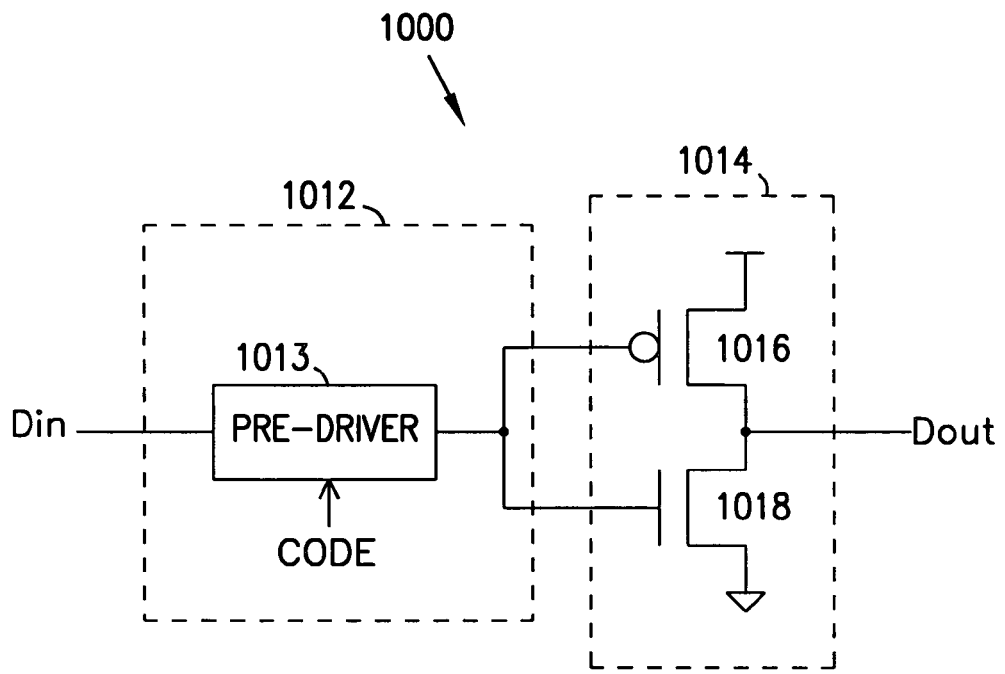
FIG. 10 shows an output circuit according to embodiments of the invention.

FIG. 10 shows an output circuit. Output circuit 1000 may be used for output circuit 110 (FIG. 1) or output circuit 410 (FIG. 4). Output circuit 1000 includes a pre-driver circuit 1012 and a driver 1014. Pre-driver circuit 1012 includes a pre-driver 1013 to receive an input signal Din and a slew code CODE. Driver 1014 includes transistors 1016 and 1018 to drive an output signal Dout. Transistor 1016 serves as a pullup device to pull the Dout signal to a first signal level when the Din signal has a first signal level. Transistor 1018 serves as a pulldown device to pull the Dout signal to a second signal level when the Din signal has a second signal level. The first and second signal level of the Din or Dout signal may be a supply voltage and ground, respectively.

Pre-driver circuit 1012 may be controlled to influence the slew of the Dout signal. In some embodiments, Pre-driver circuit 1012 may be controlled by adjusting the value of the CODE. A control loop circuit such as control loop circuit 120 or 420 of FIG. 1 or FIG. 4 may by used to adjust the CODE.

Figure 11:
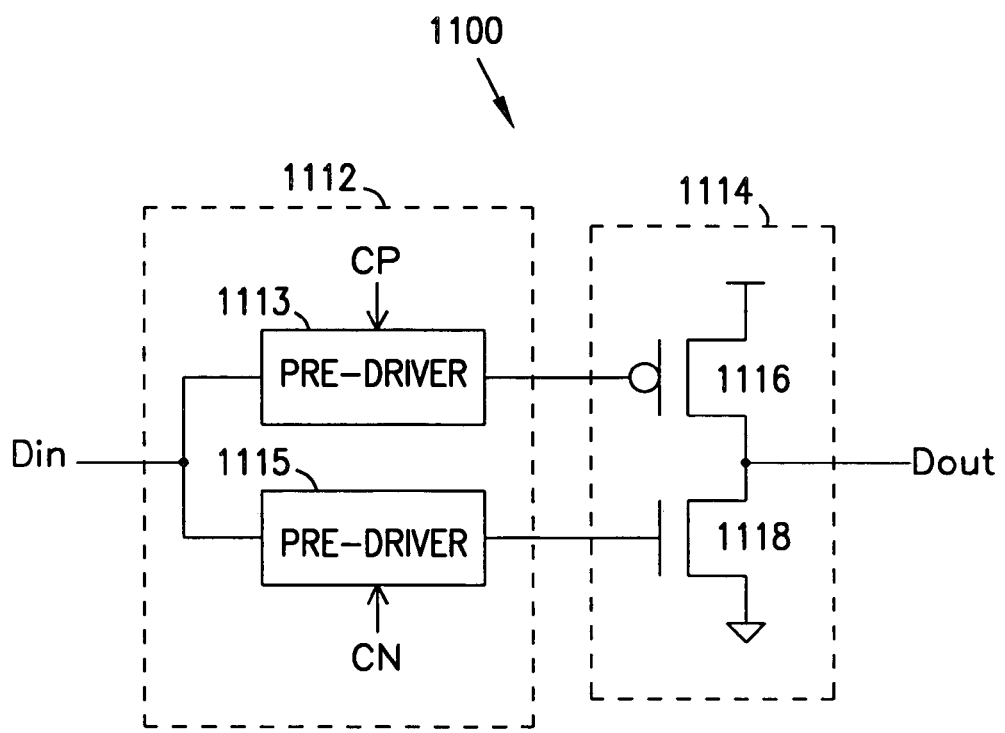
FIG. 11 shows an output circuit having multiple pre-drivers.

FIG. 11 shows an output circuit having multiple pre-drivers. Output circuit 1100 may be used for output circuit 110 (FIG. 1) or output circuit 410 (FIG. 4). Output circuit 1100 includes a pre-driver circuit 1112 and a driver 1114. Pre-driver circuit 1112 includes pre-driver 1113 and 1115, both receives an input signal Din. Pre-driver 1113 receives a slew code CP. Pre-driver 1115 receives a slew code CN. Driver 1114 includes transistors 1116 and 1118 to drive an output signal Dout. Transistor 1116 serves as a pullup device to pull the Dout signal to a first signal level when the Din signal has a first signal level. Transistor 1118 serves as a pulldown device to pull the Dout signal to a second signal level when the Din signal has a second signal level. The first and second signal level of the Din or Dout signal may be a supply voltage and ground, respectively.

Pre-driver circuits 1113 and 1115 may be controlled to influence the slew of the Dout signal. In some embodiments, pre-driver circuit 1113 may be controlled by adjusting the value of the CP code; pre-driver circuit 1115 is controlled by adjusting the value of the CN code. A control loop circuit such as control loop circuit 120 or 420 of FIG. 1 or FIG. 4 may by used to adjust the CP and CN codes.

Figure 12:
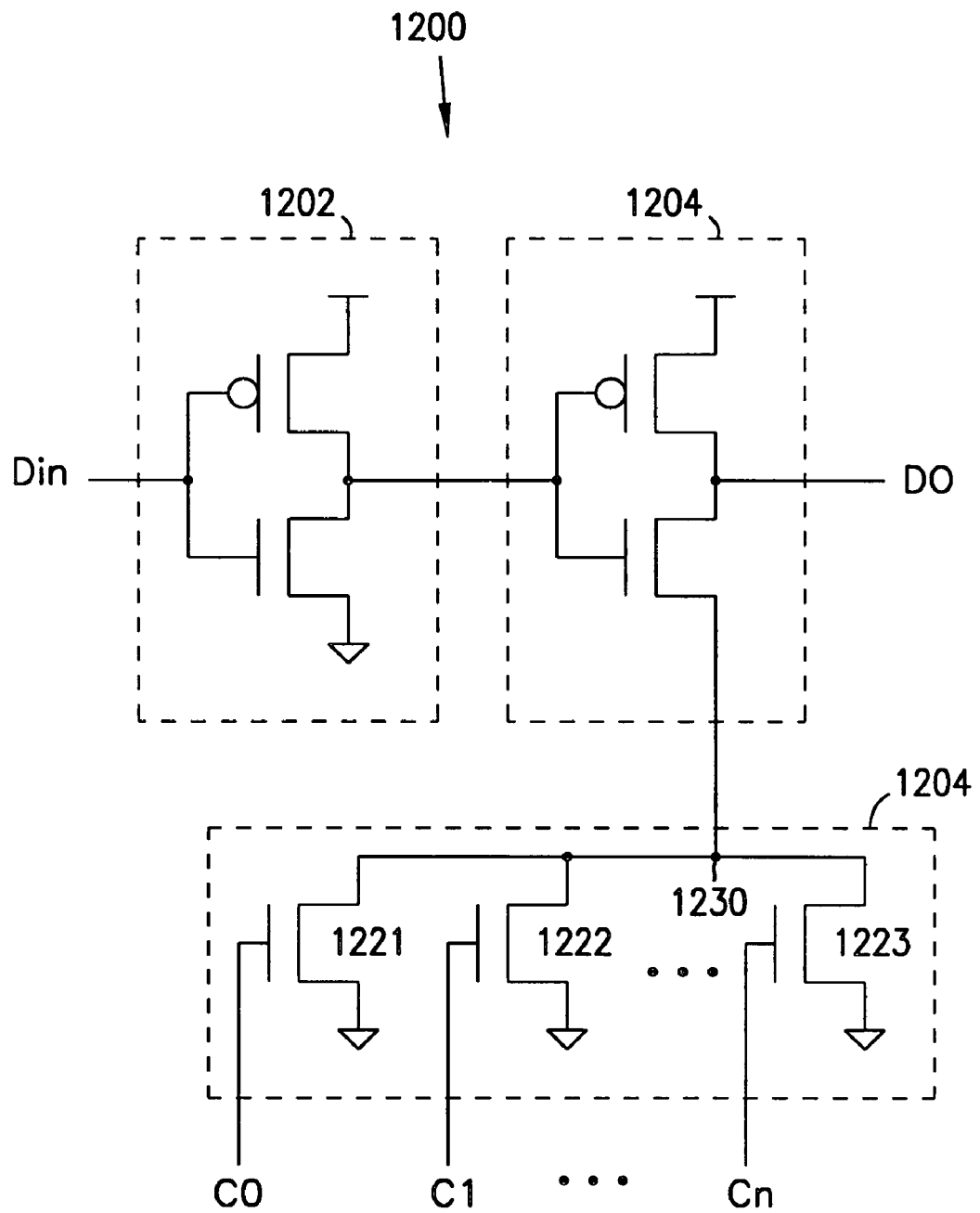
FIG. 12 shows a pre-driver according to embodiments of the invention.

FIG. 12 shows a pre-driver. Pre-driver 1200 may be used for pre-driver 1013 (FIG. 10) or pre-driver 1113 or 1115 (FIG. 11). In FIG. 12, pre-driver 1200 includes inverters 1202 and 1204, and a variable resistive circuit 1206. Inverters 1202 and 1204 form a signal path to output a pre-driver signal DO based on an input signal Din. The DO signal may feed a driver such as driver 114 (FIG. 1), driver 412 (FIG. 4), driver 1014 (FIG. 10), or driver 1114 (FIG. 11). In FIG. 12, variable resistive circuit 1206 includes a number of transistors 1221, 1222, and 1223, each having a gate controlled by one of a number of control bits C0, C1, and Cn. Transistors 1221, 1222, and 1223 form a resistive network between node 1230 and ground. In some embodiments, transistors 1221, 1222, and 1223 are binary weighted transistors.

The resistance value between node 1230 and ground are controlled by different combinations of the control bits C0, C1, and Cn. Different resistance value between node 1230 and ground influences the slew of the DO signal differently. For example, one resistance value may increase the slew of the DO signal and another resistance value may decrease the slew of the DO signal. Thus, by controlling the C0, C1, and Cn bits to adjust the resistance value, the slew of the DO signal is controlled. The C0, C1, and Cn bits may represent the slew code CODE, CP, or CN (described above). The C0, C1, and Cn bits may be controlled by a control loop circuit such as control loop circuit 120 of FIG. 1 and control loop circuit 420 of FIG. 4.

Figure 13:
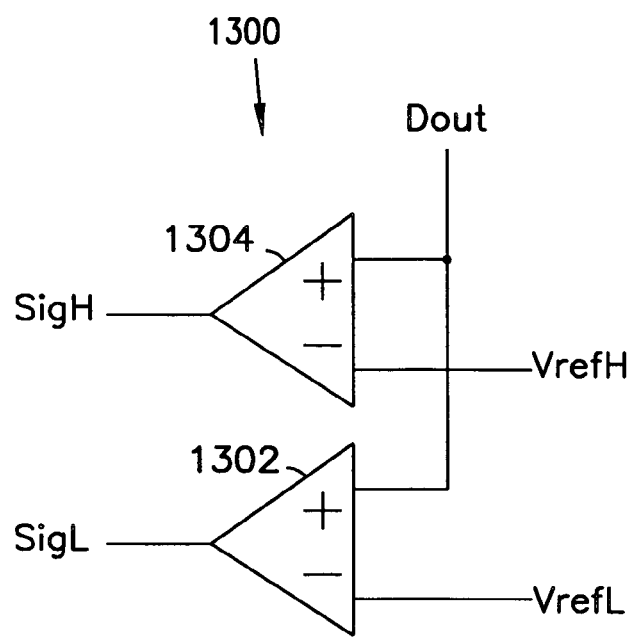
FIG. 13 shows a sensing circuit according to embodiments of the invention.

FIG. 13 shows a sensing circuit. Sensing circuit 1300 is an embodiment of a circuit that may be used as sensing circuit 430 in some embodiments of FIG. 4. In FIG. 13, sensing circuit 1300 includes comparators 1302 and 1304 to receive the Dout signal. Comparator 1302 receives a first reference signal Vref1 to produce a measured signal SigL. Comparator 1304 receives a second reference signal VrefH to produce a measured signal SigH. Comparator 1302 switches the state of the SigL signal when the rising edge of the Dout signal reaches VrefL. Comparator switches the state of the SigH signal when the rising edge of the Dout signal reaches VrefH. The signal relationships among the Dout, SigL, and SigH signals are similar to that of FIG. 5. The SigL and SigH signals of FIG. 13 may feed a compare circuit such as compare circuit 440 (FIG. 4) to adjust the slew of the Dout signal.

Figure 14:
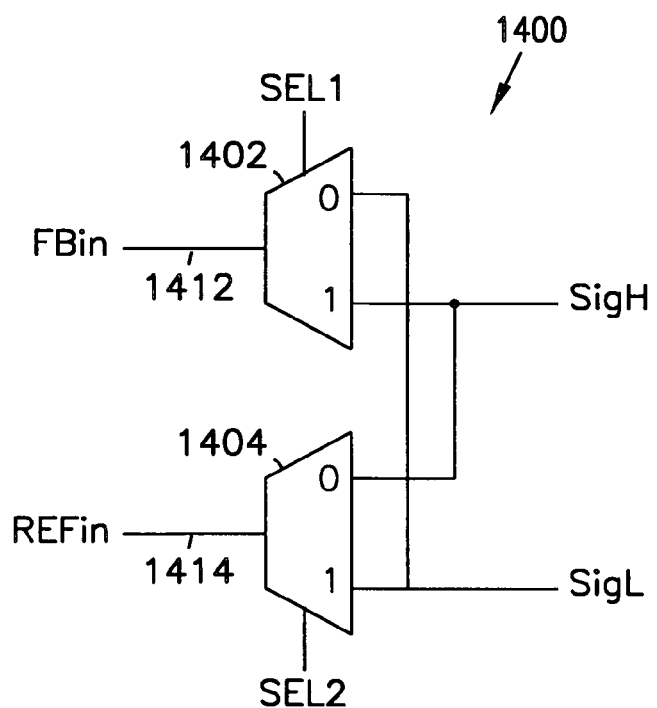
FIG. 14 shows a select circuit according to embodiments of the invention.

FIG. 14 shows a select circuit. Select circuit 1400 is an embodiment of a circuit that may be used as select circuit 460 in some embodiments of FIG. 4. In FIG. 14 select circuit 1400 includes multiplexers 1402 and 1404. Multiplexer 1402 selectively passes one of the SigL and SigH signals to an output node 1412 based on a state of a select signal SEL1. Multiplexer 1404 selectively passes one of the SigL and SigH signals to an output node 1414 based on a state of a select signal SEL2. The SEL1 and SEL2 signals may be the same signal. The SEL1 and SEL2 signal have states such that at a first state of the SEL1 and SEL2 signals, the SigL signal is passed to node 1412 and the SigH signal is passed to node 1414; and at a second state of the SEL1 and SEL2 signals, the SigL signal is passed to node 1414 and the SigH signal is passed to node 1412. Thus, depending on the states of the SEL1 and SEL2 signals, the FBin signal at node 1412 may be the SigL or SigH signal. Likewise, depending on the states of the SEL1 and SEL2 signals, the REFin signal at node 1414 may be the SigL or SigH signal. The FBin and REFin signals may feed a compare circuit such as compare circuit 440 (FIG. 4) to adjust the slew of the Dout signal.

Figure 15:
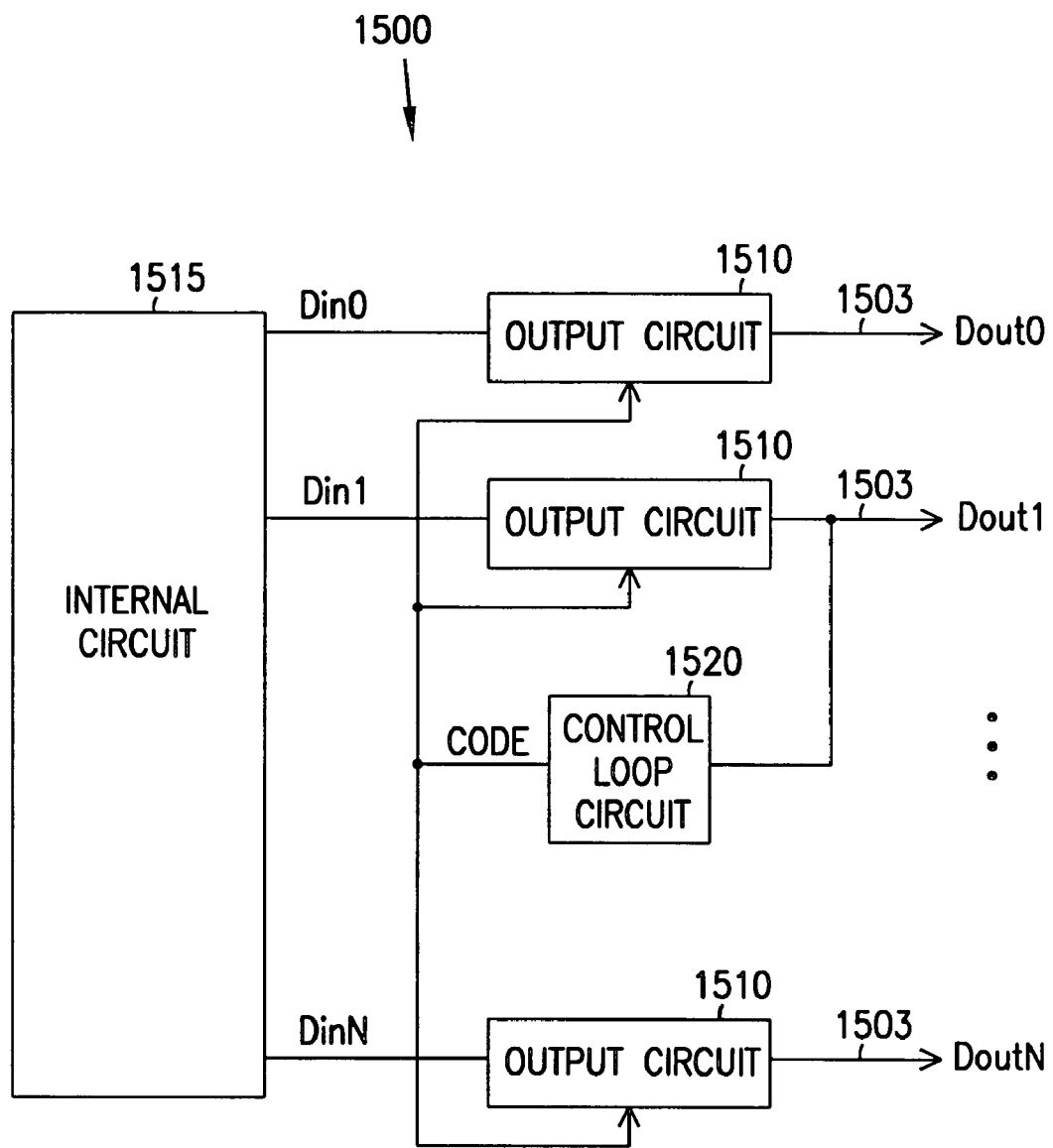
FIG. 15 shows an integrated circuit having multiple output circuits and a control loop circuit according to embodiments of the invention.

FIG. 15 shows an integrated circuit having multiple output circuits and a control loop circuit. Integrated circuit 1500 includes a number of output circuits 1510. Each output circuit 1510 receives one of the input signals Din0, Din1 through DinN signals and outputs one of the output signals Dout0, Dout1 through DoutN signals. Each output circuit 1510 also receives a slew code CODE. The Din0, Din1 through DinN signals are generated by an internal circuit 1515. The Dout0, Dout1 through DoutN signals are provided to pins 1503.

Integrated circuit 1500 also includes a control loop circuit 1520 to control the slew of each of the Dout0, Dout1 through DoutN signals by adjusting the CODE based on the slew of one of the Dout0, Dout1 through DoutN signals. Control loop circuit 1520 and each of the output circuits 1510 include embodiments of output circuit 110 and control loop circuit 120 of FIG. 1 or embodiments of output circuit 410 and control loop circuit 420 of FIG. 4. In FIG. 15, control loop circuit 1520 controls the slew of the Dout0, Dout1 through DoutN signals by adjusting the CODE based on the slew of the Dout1 signal. Control loop circuit 1520 adjusts the CODE to match the slew of each of the Dout0, Dout1 through DoutN signals with a target slew.

Figure 16:
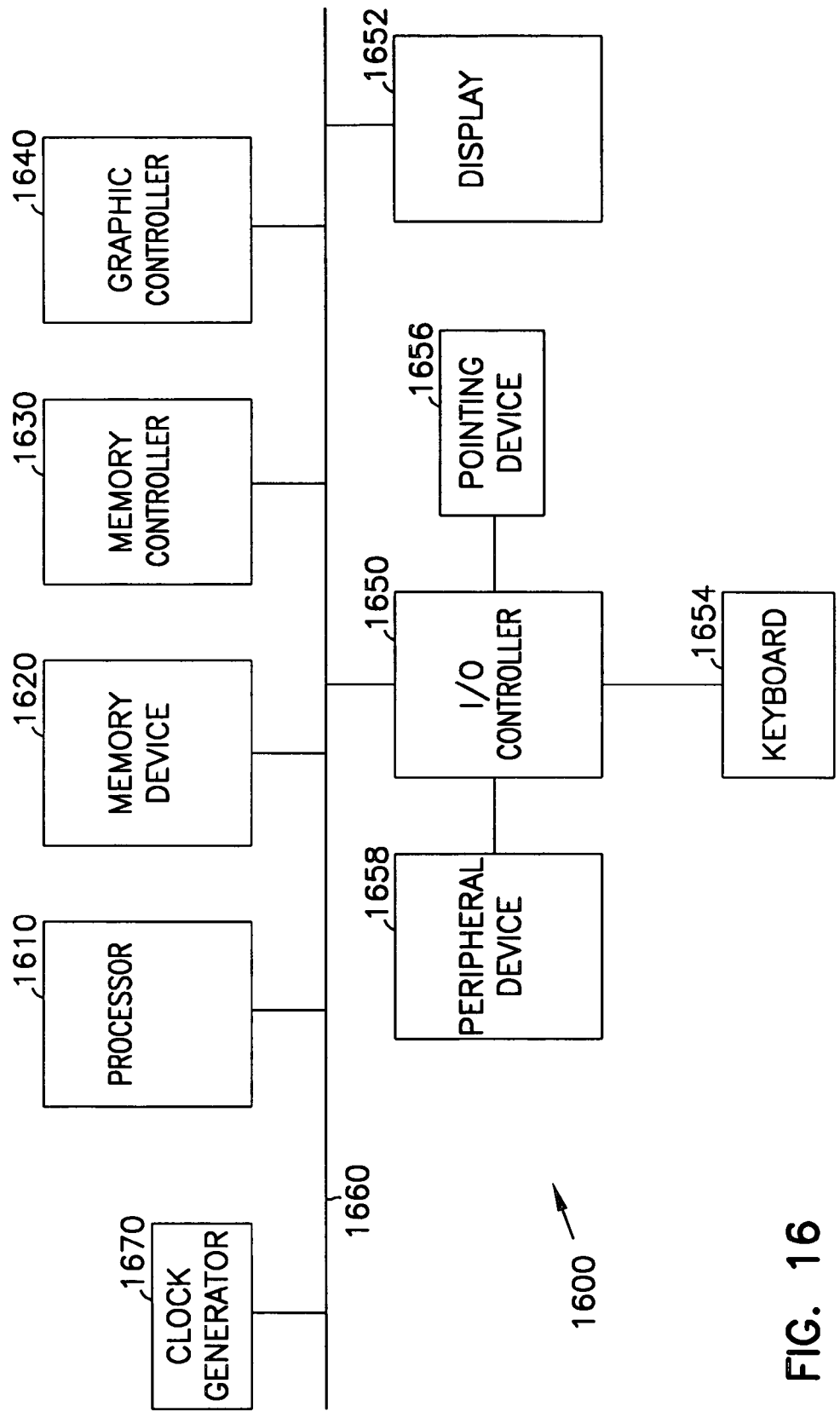
FIG. 16 shows a system according to embodiments of the invention.

FIG. 16 shows a system. System 1600 includes a processor 1610, a memory device 1620, a memory controller 1630, a graphic controller 1640, an input and output (I/O) controller 1650, a display 1652, a keyboard 1654, a pointing device 1656, and a peripheral device 1658. A bus 1660 connects all of these devices together. A clock generator 1670 provides an external clock signal to at least one of the devices of system 1600. Two or more devices shown in system 1600 may be formed in a single chip. In some embodiments, system 1600 may omit one or more devices shown in FIG. 16.

Bus 1660 may be conducting traces on a circuit board or may be one or more cables. Bus 1660 may also connect the devices of system 1600 by wireless means such as electromagnetic radiation (e.g., radio waves). Peripheral device 1658 may be a printer, an optical device (e.g., a CD-ROM device or a DVD device), a magnetic device (e.g., floppy disk driver), or an audio device (e.g., a microphone). Memory device 1620 may be a dynamic random access memory (DRAM) device, a static random access memory (SRAM) device, or may be a flash memory device, or a combination thereof.

At least one of the devices shown in system 1600 includes an embodiment of integrated circuit 1500 of FIG. 15, in which integrated circuit 1500 may include embodiments of FIG. 1 through FIG. 14. Thus, at least one of the devices shown in system 1600 includes at least one output circuit and a control loop circuit to adjust the slew of at least one signal at a pin. For example, one or more of devices shown in system 1600 may include a control loop circuit and pins connected to bus 1660, in which the control loop circuit adjusts a slew code to match the slew of one or more output signals at one or more of the pins with a target slew.

System 1600 of FIG. 16 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

What is claimed is:

1. An integrated circuit comprising:
   an output circuit to output an output signal, the output circuit including a pre-driver circuit to receive a rising slew code and a falling slew code, wherein the pre-driver circuit includes a first pre-driver having a number of control nodes to receive the rising slew code, and a second pre-driver having a number of control nodes to receive the falling slew code;
   a sensing circuit to measure a rising slew and a falling slew of the output signal;
   a compare circuit to compare each of the rising slew and the falling slew with a target slew; and
   an adjust circuit responsive to the compare circuit to adjust at least one of the rising slew code and the falling slew code.

2. The integrated of claim 1, wherein the output circuit further includes a driver, the driver having a pullup device coupled to the first pre-driver and a pulldown device coupled to the second pre-driver.

3. An integrated circuit comprising:
   an output circuit to output an output signal, the output circuit including a pre-driver circuit to receive a rising slew code and a falling slew code;
   a sensing circuit to measure a rising slew and a falling slew of the output signal wherein the sensing circuit includes:
     a first comparator to provide a first signal based on a comparison between the output signal and a first reference signal; and
     a second comparator to provide a second signal based on the output signal and a second reference signal, wherein a delay between a first edge of the first signal and a first edge of the second signal represents one of the rising slew and falling slew of the output signal
   a compare circuit to compare each of the rising slew and the falling slew with a target slew; and
   an adjust circuit responsive to the compare circuit to adjust at least one of the rising slew code and the falling slew code.

4. An integrated circuit comprising:
   an output circuit to output an output signal, the output circuit including a pre-driver circuit to receive a rising slew code and a falling slew code;
   a sensing circuit to measure a rising slew and a falling slew of the output signal; a compare circuit to compare each of the rising slew and the falling slew with a target slew, wherein the compare circuit includes a first delay line to delay a first signal to produce a first delayed signal, a second line to delay a second signal to produce a second delayed signal, and a phase detector circuit to compare a phase relationship between the first delayed signal and the second delayed signal; and
   an adjust circuit responsive to the compare circuit to adjust at least one of the rising slew code and the falling slew code.

5. The integrated circuit of claim 4, wherein:
   the first delay line is configured to apply a first delay to the first signal based on a first delay code, and
   the second delay line is configured to apply a second delay to the second signal based on a second delay code.

6. The integrated circuit of claim 5 further comprising a delay code generator programmable to set the first delay code and the second delay code based on the target delay.

7. An integrated circuit comprising:
an output circuit to output an output signal, the output circuit including a pre-driver circuit to receive a rising slew code and a falling slew code;
a sensing circuit to measure a rising slew and a falling slew of the output signal;
a compare circuit to compare each of the rising slew and the falling slew with a target slew;
an adjust circuit responsive to the compare circuit to adjust at least one of the rising slew code and the falling slew code; and
a selector to select one of a measurement of the rising slew and a measurement of the falling slew of the output signal.

8. A method comprising:
setting a slew code for a signal path;
driving an output signal at an output node of the signal path; measuring the slew of the output signal to obtain a measured slew, wherein measuring the slew of the output signal includes producing an edge of a first signal based on a first signal level of an edge the output signal, and producing an edge of a second signal based on a second signal level of the edge of the output signal, wherein a time interval between the edge of the first signal and the edge of the second signal represents the measured slew of the output signal;
comparing the measured slew with a target slew, wherein comparing the measured slew with the target slew includes delaying the first signal by a first delay to produce a first delayed signal, delaying the second signal by a second delay to produce a second delayed signal, and comparing a phase relationship between the first delayed signal and the second delayed signal; and
modifying the slew code based on the comparison.

9. The method of claim 8, wherein modifying the slew code includes:
increasing a value of the slew code based on a first condition of the phase relationship between the first delayed signal and the second delayed signal; and
decreasing the value of the slew code based on a second condition of the phase relationship between the first delayed signal and the second delayed signal.

10. The integrated circuit of claim 1, wherein the compare circuit includes a delay line having a number of input nodes to receive delay codes representing the target slew.

11. The integrated circuit of claim 10, wherein the adjust circuit includes:
a first state machine having input nodes coupled to the compare circuit and output nodes coupled to the control nodes of the first pre-driver; and
a second state machine having input nodes coupled to the compare circuit and output nodes coupled to the control nodes of the second pre-driver.

12. The integrated circuit of claim 3, wherein the compare circuit includes a delay line having a number of input nodes to receive delay codes representing the target slew.

13. The integrated circuit of claim 12, wherein the adjust circuit includes:
a first state machine having input nodes coupled to the compare circuit and output nodes coupled to the pre-driver circuit; and
a second state machine having input nodes coupled to the compare circuit and output nodes coupled to the pre-driver circuit.

14. The integrated circuit of claim 7, wherein the compare circuit includes a delay line having a number of input nodes to receive delay codes representing the target slew.

15. The integrated circuit of claim 14, wherein the adjust circuit includes:
a first state machine having input nodes coupled to the compare circuit and output nodes coupled to the pre-driver circuit; and
a second state machine having input nodes coupled to the compare circuit and output nodes coupled to the pre-driver circuit.

16. A system comprising:
a first integrated circuit including,
an output circuit to output an output signal, the output circuit including a pre-driver circuit to receive a rising slew code and a falling slew code, wherein the pre-driver circuit includes a first pre-driver having a number of control nodes to receive the rising slew code, and a second pre-driver having a number of control nodes to receive the falling slew code;
a sensing circuit to measure a rising slew and a falling slew of the output signal;
a compare circuit to compare each of the rising slew and the falling slew with a target slew; and
an adjust circuit responsive to the compare circuit to adjust at least one of the rising slew code and the falling slew code; and
a second integrated circuit coupled to the first integrated circuit, wherein one of the first and second integrated circuit includes a random access memory device.

17. The system of claim 16, wherein the output circuit further includes a driver, the driver having a pullup device coupled to the first pre-driver and a pulldown device coupled to the second pre-driver.

18. The system of claim 16, wherein the compare circuit includes a delay line having a number of input nodes to receive delay codes representing the target slew.

19. The system of claim 18, wherein the adjust circuit includes:
a first state machine having input nodes coupled to the compare circuit and output nodes coupled to the control nodes of the first pre-driver; and
a second state machine having input nodes coupled to the compare circuit and output nodes coupled to the control nodes of the second pre-driver.

* * * * *